(12) United States Patent
Han et al.

(10) Patent No.: US 9,070,759 B2
(45) Date of Patent: Jun. 30, 2015

(54) SEMICONDUCTOR DEVICE AND METHOD OF MAKING SAME

(75) Inventors: Jin-Ping Han, Fishkill, NY (US); Haoren Zhuang, Hopewell Junction, NY (US); Jiang Yan, Newburgh, NY (US); Jingyu Lian, Walkill, NY (US); Manfred Eller, Wappingers Falls, NY (US)

(73) Assignee: Infineon Technologies AG, Neubiberg (DE)

( * ) Notice: Subject to any disclaimer, the term of this patent is extended or adjusted under 35 U.S.C. 154(b) by 1435 days.

(21) Appl. No.: 11/526,499

(22) Filed: Sep. 25, 2006

(65) Prior Publication Data

US 2008/0076214 A1  Mar. 27, 2008

(51) Int. Cl.
| | | |
|---|---|---|
| *H01L 21/336* | (2006.01) | |
| *H01L 21/311* | (2006.01) | |
| *H01L 29/51* | (2006.01) | |
| *H01L 29/78* | (2006.01) | |
| *H01L 29/423* | (2006.01) | |
| *H01L 21/28* | (2006.01) | |
| *H01L 29/49* | (2006.01) | |
| *H01L 29/66* | (2006.01) | |
| H01L 21/8238 | (2006.01) | |

(52) U.S. Cl.
CPC .......... *H01L 29/78* (2013.01); *H01L 29/42368* (2013.01); *H01L 29/42364* (2013.01); *H01L 29/517* (2013.01); *H01L 21/28017* (2013.01); *H01L 29/51* (2013.01); *H01L 21/28194* (2013.01); *H01L 21/28123* (2013.01); *H01L 21/28273* (2013.01); *H01L 21/28282* (2013.01); *H01L 21/82385* (2013.01); *H01L 29/4983* (2013.01); *H01L 29/513* (2013.01); *H01L 29/66575* (2013.01); *H01L 29/66636* (2013.01)

(58) Field of Classification Search
CPC .................. H01L 21/28017; H01L 21/28194; H01L 29/51; H01L 29/513; H01L 29/517; H01L 29/42364; H01L 29/42368; H01L 29/66575
USPC ........... 438/197; 257/288, E29.132–E29.133, 257/E29.135
See application file for complete search history.

(56) References Cited

U.S. PATENT DOCUMENTS

| | | | | |
|---|---|---|---|---|
| 5,268,590 | A  * | 12/1993 | Pfiester et al. | 257/764 |
| 6,207,995 | B1 * | 3/2001 | Gardner et al. | 257/344 |
| 6,326,273 | B1 * | 12/2001 | Yu | 438/301 |
| 6,602,805 | B2 * | 8/2003 | Chang | 438/785 |
| 6,956,263 | B1 * | 10/2005 | Mistry | 257/330 |
| 7,109,079 | B2 * | 9/2006 | Schaeffer et al. | 438/199 |
| 2001/0023120 | A1 * | 9/2001 | Tsunashima et al. | 438/585 |
| 2002/0072180 | A1 * | 6/2002 | Yugami et al. | 438/299 |
| 2004/0097047 | A1 * | 5/2004 | Natzle et al. | 438/300 |
| 2005/0093084 | A1 * | 5/2005 | Wang et al. | 257/410 |
| 2006/0205133 | A1 * | 9/2006 | Trivedi et al. | 438/199 |

\* cited by examiner

*Primary Examiner* — Marvin Payen
*Assistant Examiner* — Jeremy Joy
(74) *Attorney, Agent, or Firm* — Slater & Matsil, L.L.P.

(57) ABSTRACT

A method of making a semiconductor device is disclosed. A device is fabricated on a semiconductor body. A gate electrode is disposed over the semiconductor body with a gate dielectric between the gate electrode and the semiconductor body, wherein the gate dielectric has a length greater than the gate electrode. A first source/drain region is disposed within the semiconductor body adjacent to the first edge of the gate with the gate dielectric at least partially overlapping the first source/drain region, and a second source/drain region is disposed within the semiconductor body adjacent to the first edge of the gate with the gate dielectric at least partially overlapping the second source/drain region.

16 Claims, 9 Drawing Sheets

SEMICONDUCTOR DEVICE AND METHOD OF MAKING SAME

TECHNICAL FIELD

This invention relates generally to semiconductor devices and methods, and more particularly to devices and methods for controlling the threshold voltage MOS transistors in order to optimize performance.

BACKGROUND

Semiconductor devices are used in a large number of electronic devices, such as computers, cell phones and others. One of the goals of the semiconductor industry is to continue shrinking the size and increasing the speed of individual devices. Smaller devices can operate at higher speeds since the physical distance between components is smaller. As the size and geometries of semiconductor devices get smaller, however, the voltages that the devices withstand get smaller too.

In the field of submicron CMOS devices, higher speeds and smaller power supply voltages require that the threshold voltage, $V_T$, of the transistor be tightly controlled. First, better control of the transistor threshold voltage allows for more uniform performance of high speed parts, as well as making the circuit design easier because of the more predictable device characteristics. Second, if the threshold voltage is too high, the device may operate slower. If, on the other hand, the threshold is too low, device leakage may be too high. In submicron CMOS devices, however, better $V_T$ controllability is desired, but better $V_T$ controllability becomes more difficult to achieve as the geometries shrink.

SUMMARY OF THE INVENTION

In one embodiment a semiconductor device is fabricated on a semiconductor body. A gate electrode is disposed over the semiconductor body with a gate dielectric between the gate electrode and the semiconductor body, wherein the gate dielectric has a length greater than the gate electrode. A first source/drain region is disposed within the semiconductor body adjacent to the first edge of the gate with the gate dielectric at least partially overlapping the first source/drain region, and a second source/drain region is disposed within the semiconductor body adjacent to the first edge of the gate with the gate dielectric at least partially overlapping the second source/drain region.

The foregoing has outlined rather broadly features of the present invention. Additional features of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The invention will now be described with respect to preferred embodiments in a specific context, namely an MOS device. Concepts of the invention can also be applied, however, to other electronic devices. For, example, MOS-like (MNOS, MONOS, MIS), floating gate flash memory cells (MOMOS, MIMIS), and ferroelectric devices (MFIS, MIFIS, MFS) can utilize concepts of the present invention.

Figure 1:
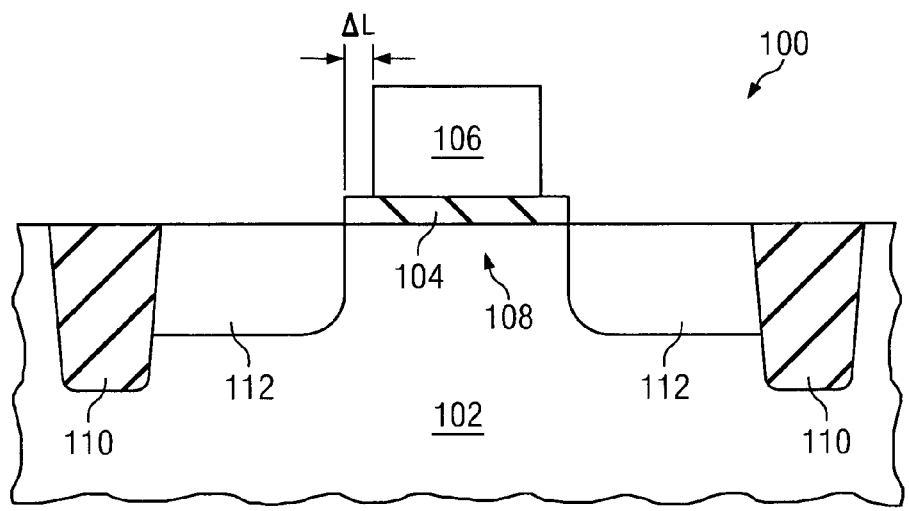
FIG. 1 illustrates a transistor device fabricated using concepts of the present invention.

An exemplary transistor device is shown in FIG. 1, and various methods for the formation of transistor devices using these concepts will then be described with respect to FIGS. 3a-3g, 4a-4d, and 5a-5f.

Referring first to FIG. 1, transistor 100 is formed on a semiconductor body 102. Shallow trench isolation regions (STI) 110, a gate dielectric 104 and a gate electrode 106 are disposed at a surface over the body 102, which includes a channel region 108. Source/drain regions 112 are formed in the semiconductor body 102 adjacent to gate dielectric 104 and STI regions 110.

In a preferred embodiment of the present invention, the semiconductor body 102 may be a bulk monocrystalline substrate, or a layer of silicon-on-insulator substrate. In other embodiments, other materials may be utilized. As shown in FIG. 1, in a preferred embodiment of the present invention, isolation is achieved with STI regions 110. In other embodiments, other isolation techniques can be used. For example, STI regions 110 can be replaced with deep trench isolation regions, field oxide isolation regions, or other regions.

The gate stack comprises a gate dielectric 104 and a gate electrode 106. The gate dielectric 104 may comprise an oxide, a nitride, or a combination of oxide and nitride. In preferred embodiments, a high-k dielectric may be used. In an embodiment of the present invention, the gate dielectric 104 is longer than the gate electrode 106, i.e., the gate dielectric 104 extends further toward the source/drain regions 112 than the gate 106.

Source/drain regions 112 are highly doped regions. In a p-channel device, source/drain regions 112 may be doped with boron ions or other ions that would create a p-type region. In an n-channel device, on the other hand, source/ drain regions 112 may be doped with arsenic or phosphorous or other ions that would create an n-type region. While not illustrated in FIG. 1, lightly doped source/drain regions and/or halo regions can be included in the structure.

In certain aspects, the overlap of the gate dielectric 104 with gate 106 can be used to control the threshold voltage of the transistor. The equation for the threshold voltage of a MOS transistor is $$V_t = 2\phi_b + \frac{2(qN_A\varepsilon_s\phi_b)^{1/2}}{C_{OX}} + \phi_{ns} - \frac{Q'_{OX}}{C_{OX}} - \frac{Q'_{it}}{C_{OX}},$$

where $\phi_b$ is the silicon bending potential, q is the unit charge, $N_A$ is the acceptor doping concentration, $C_{OX}$ is capacitance cross dielectric, $Q'_{OX}$ is the fixed dielectric charge, and $Q'_{it}$ is the interface trap charge. $V_T$ can be controlled by adjusting the doping concentration of the channel using ion implants, thereby effecting $N_A$. As the channel regions get smaller, however, the number of dopant atoms in the channel becomes small and more prone to statistical fluctuation, thereby introducing more statistical variation in the resulting threshold voltage. $V_T$ can be also be controlled by careful design of the gate stack formation and by using high-k dielectrics.

As can be seen by the equation, however, the magnitude of the fixed dielectric charge, $Q'_{OX}$, and the interface trap charge, $Q'_{it}$, can also affect the threshold voltage. Controlling the magnitude of $Q'_{OX}$ and $Q'_{it}$ is challenging because these charges are usually introduced as a result of process damage caused by reactive ion etching (RIE) or ion implantation at the corners of the gate dielectric. In a conventional CMOS process, hydrogen annealing can be used to reverse the process damage to some extent. The problem with hydrogen annealing, though, is that the reversal of process damage is never perfect or complete, and the annealing step adds cost to the process.

While hydrogen annealing can reverse the process damage caused by RIE and ion implantation at the corners of the gate dielectric, hydrogen annealing still adds an additional annealing process step. A preferred embodiment of the present invention avoids this extra annealing step by introducing a structural change in the formation of the CMOS device. Rather than annealing to reduce the effect of dielectric charge, $Q'_{OX}$, and the interface trap charge, $Q'_{it}$, a small length offset, ΔL, is introduced between the gate electrode 106 (FIG. 1) and the gate dielectric 104 so that the gate dielectric 104 is longer than the gate electrode 106. By introducing such a length offset, ΔL, the damaging effects caused by RIE and ion implantation occur at the extended edges of the gate dielectric so that charge is not induced between the gate electrode 106 and the channel 108.

In the preferred embodiment, the gate is sized to achieve a gate length of 60 nm or less. In various embodiments the gate offset length, ΔL, can be between about 2% and about 10%, preferably about 4% to about 5%, of the length of the gate 106. For example, in one embodiment, the gate length is about 45 nm and the offset length, ΔL, is about 2 nm. In other embodiments, the size may vary. It is possible that longer ΔL (e.g., up to 60 nm) may also work, as long as the gate dielectric is sufficiently thin so that ext/halo I/I are effective enough.

One advantage of the preferred embodiment of the present invention is that the recovering hydrogen annealing step is not required to reduce the effect of dielectric charge, $Q'_{OX}$, and the interface trap charge, $Q'_{it}$.

Figure 2A:
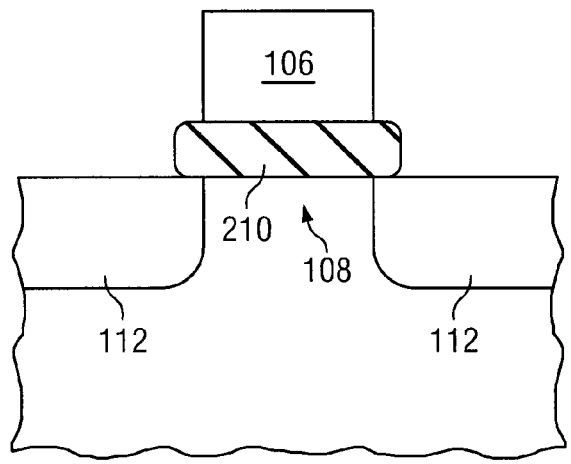
FIGS. 2a-2d illustrate alternate embodiments of the present invention.
Figure 2B:
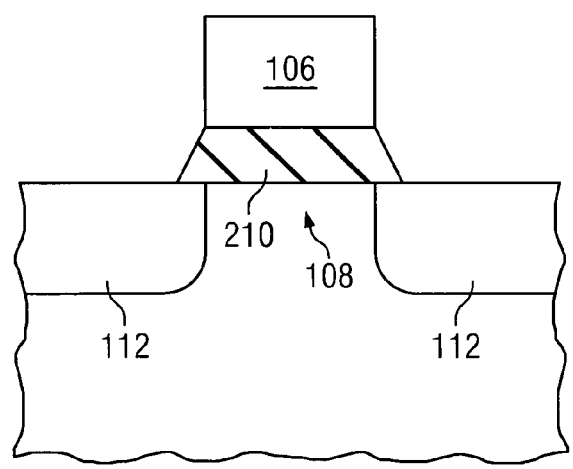
Figure 6:
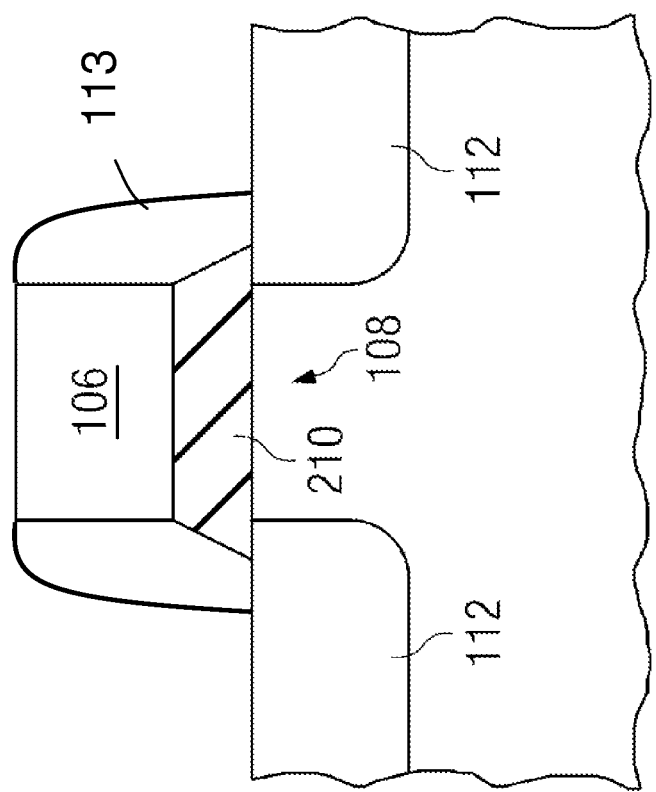
FIG. 6 illustrates the alternate embodiment illustrated in FIG. 2b.

FIGS. 2a-2d show alternate embodiments of the present invention. In the embodiment of FIG. 1, the gate dielectric was substantially rectangular. Rather than being rectangular the extended gate dielectric area 210 can be rounded, as shown in FIG. 2a, or trapezoidal as shown in FIG. 2b. The embodiment of FIG. 2b is illustrated again in FIG. 6 with additional spacers 113. Alternatively, the edges of the gate dielectric area 210 may take on other shapes not shown in the figures. An advantage of shaping the edges of the extended gate dielectric area is to prevent unnecessary charges from damage and to introduce desired charges in the dielectric from corners via implant, Ultra-violet (UV), Plasma or other ways, so that the threshold voltage (Vt) can be tuned or controlled by removing or adding charges.

Figure 2C:
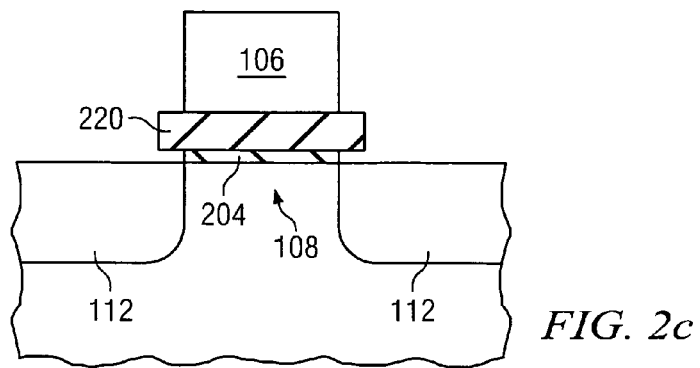

In FIG. 2c, an embodiment of the present invention is shown where a high-k dielectric 220 is deposited over an interfacial/barrier layer 204. The interfacial/barrier can be made of oxide or nitride, as examples. FIG. 2c shows the high-k dielectric as being wider than the interfacial/barrier layer. Alternatively, the interfacial/barrier layer can be the same width of the high-k dielectric.

Figure 2D:
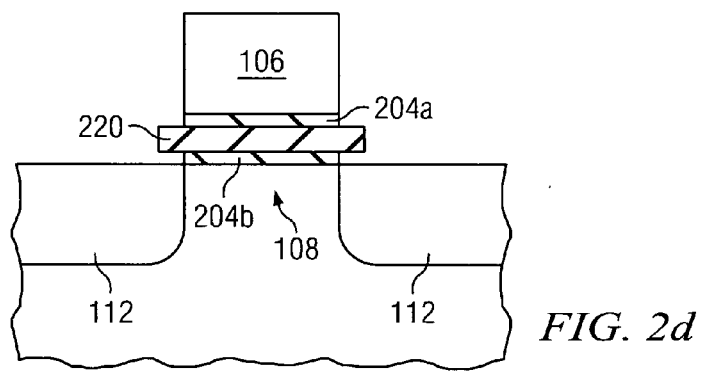

In FIG. 2d, an embodiment of the present invention is shown where a high-k dielectric 220 is deposited between interfacial/barrier layers 204a and 204b. Similar to FIG. 2c, FIG. 2d shows the high-k dielectric as being wider than the interfacial/barrier layer. Alternatively, the interfacial/barrier layers can be the same width of the high-k dielectric.

FIGS. 3-5 will now be provided to illustrate various embodiments for forming a semiconductor device of the present invention. While certain details may be explained with respect to only one of the embodiments, it is understood that these details can also apply to other ones of the embodiments.

Figure 3A:
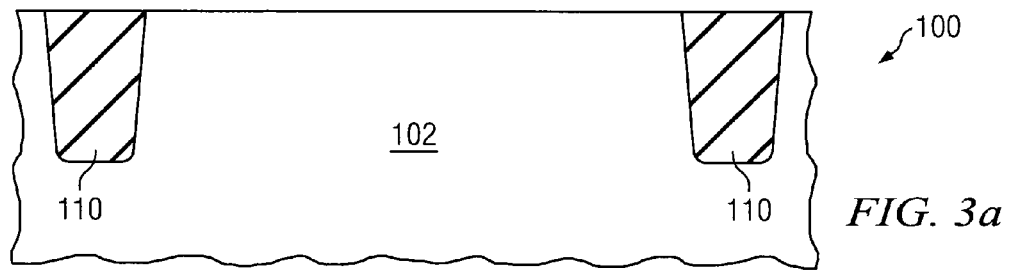
FIGS. 3a-3g provide cross-sectional views of a first embodiment process.

FIGS. 3a-3g provide cross-sectional views that illustrate a first embodiment for forming a semiconductor device 100 of the present invention Referring first to FIG. 3a, a semiconductor body 102 is provided. In the first embodiment, the semiconductor body 102 is a silicon wafer. For example, the body 102 can be a bulk monocrystalline silicon substrate (or a layer grown thereon or otherwise formed therein) or a layer of a silicon-on-insulator (SOI) wafer. In other embodiments, other semiconductors such as silicon germanium, germanium, gallium arsenide or others can be used with the wafer.

In a preferred embodiment, STI regions 110 are formed in the semiconductor body 102. First, isolation trenches can be formed using conventional techniques. For example, a hard mask layer (not shown here), such as silicon nitride, can be formed over the semiconductor body 102 and patterned to expose the isolation areas. The exposed portions of the semiconductor body 102 can then be etched to the appropriate depth.

The trenches are then filled with an isolating material. For example, exposed silicon surfaces can be thermally oxidized to form a thin oxide layer. The trenches can then be lined with a first material such as a nitride layer (e.g., $Si_3N_4$). The trenches can then be filled with a second material, such as an oxide. For example, a high density plasma (HDP) can be performed, with the resulting fill material being referred to as HDP oxide. In other embodiments, other trench filling processes can be used.

Figure 3B:
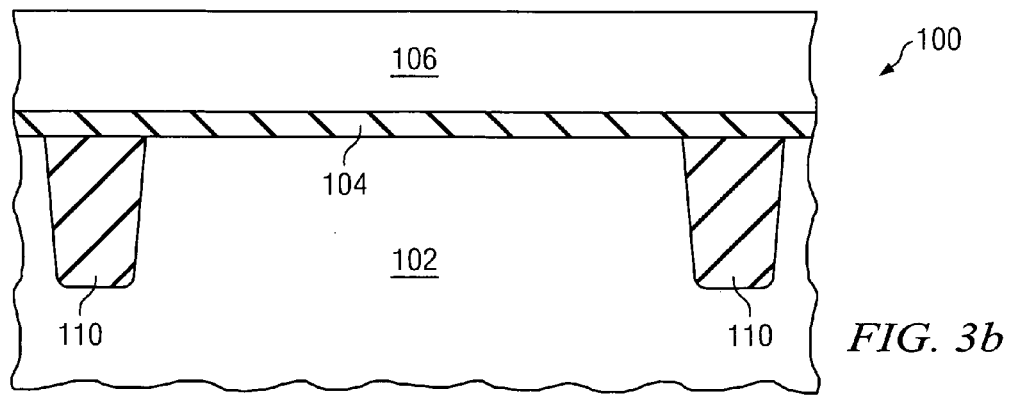

As also shown in FIG. 3b, a gate stack is formed. A gate dielectric 104 is deposited over exposed portions of the semiconductor body 102. In one embodiment, the gate dielectric 104 comprises an oxide (e.g., $SiO_2$), a nitride (e.g., $Si_3N_4$), or a combination of oxide and nitride (e.g., SiON, or an oxide-nitride-oxide sequence). In other embodiments, a high-k dielectric material having a dielectric constant of about 5.0 or greater is used as the gate dielectric 104. Suitable high-k materials include $HfO_2$, $HfSiO_x$, $Al_2O_3$, $ZrO_2$, $ZrSiO_x$, $Ta_2O_5$, $La_2O_3$, $CeO_2$, $YxOy$, nitrides thereof, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, combinations thereof, or combinations thereof with $SiO_2$, as examples. Alternatively, the gate dielectric 104 can comprise other high-k insulating materials or other dielectric materials. As implied above, the gate dielectric 104 may comprise a single layer of material, or alternatively, the gate dielectric 104 may comprise two or more layers, of the same or different materials.

The gate dielectric 104 may be deposited by chemical vapor deposition (CVD), atomic layer deposition (ALD), metal organic chemical vapor deposition (MOCVD), physical vapor deposition (PVD), or jet vapor deposition (JVD), epitaxial deposition (Epi-), as examples. In other embodiments, the gate dielectric 104 may be deposited using other suitable deposition techniques. The gate dielectric 104 preferably comprises a thickness of about 10 Å to about 60 Å in one embodiment, although alternatively, the gate dielectric 104 may comprise other dimensions.

In some embodiments, the same dielectric layer would be used to form the gate dielectric 104 for both the p-channel and n-channel transistors of a CMOS device. This feature is not required, however. In alternate embodiments, the p-channel transistor and the n-channel transistor could each have different gate dielectrics.

The gate electrode 106 is formed over the gate dielectric 104. The gate electrode 106 preferably comprises a semiconductor material, such as polysilicon or amorphous silicon, although alternatively, other semiconductor materials may be used for the gate electrode 106. In other embodiments, the gate electrode 106 may comprise TiN, HfN, TaN, W, Al, Ru, RuTa, TaSiN, $NiSi_x$, $CoSi_x$, $TiSi_x$, Ir, Y, Pt, Ti, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, a partially silicided gate material, a fully silicided gate material (FUSI), other metals, and/or combinations thereof, as examples. In one embodiment, the gate electrode 106 comprises a doped polysilicon layer underlying a silicide layer (e.g., titanium silicide, nickel silicide, tantalum silicide, cobalt silicide, or platinum silicide).

Figure 3C:
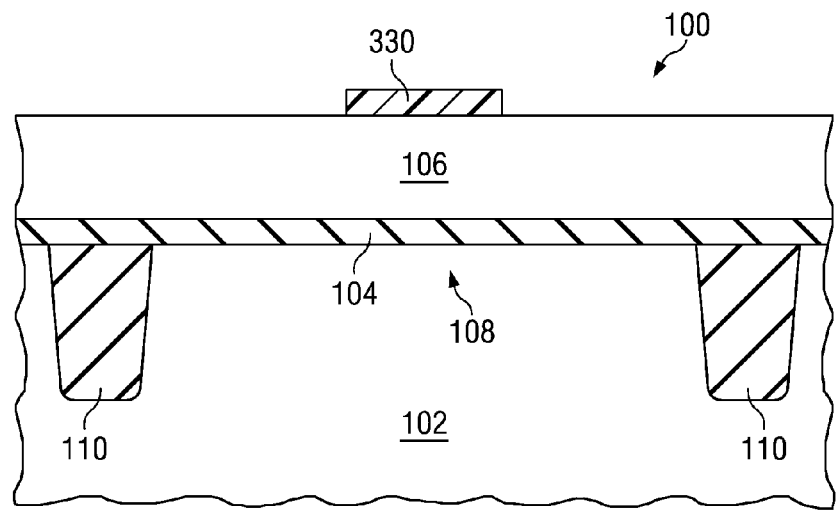

As shown in FIG. 3c, a layer of photoresist 330 is formed over the surface of the semiconductor body where the gate region is to be formed. In this embodiment, after the gate layer photoresist (not shown) is applied, a conventional poly reactive ion etch (RIE) is used with high oxygen main etch and over etch to form the residual dielectric surface. Typical gasses used in this etching process are HBr, $O_2$, and He. In other embodiments of the present invention, other standard techniques may be used to achieve the same result. For example, these embodiments could use selective wet or dry etch, or plasma ashing. In a preferred embodiment of the present invention, the gate layer will be etched to achieve a gate length of less than 60 nm, for example, 45 nm.

Figure 3D:
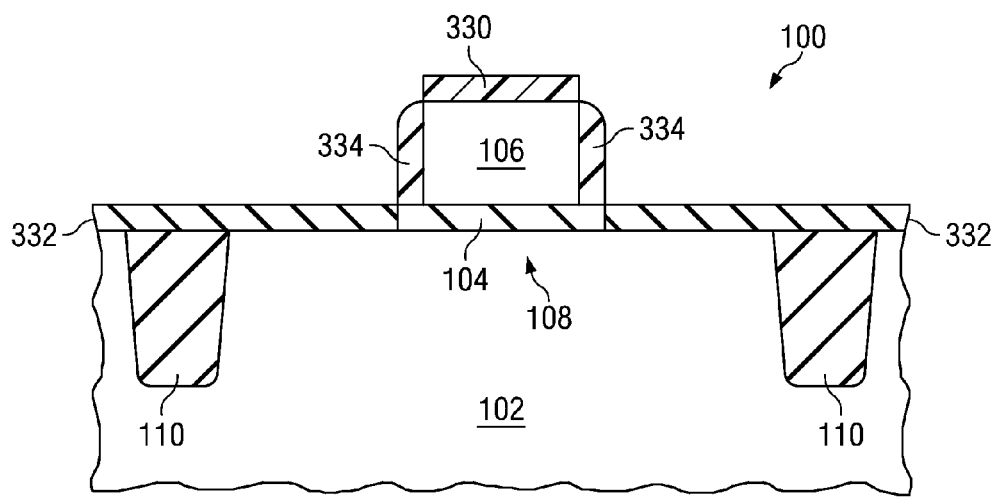
Figure 3E:
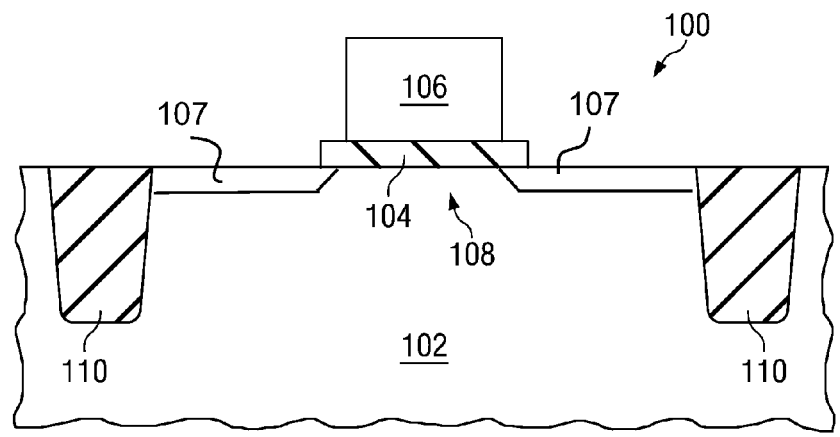

After the RIE, damaged dielectric regions 332 remain, as well as sidewall build-up 334 as shown in FIG. 3d. The exposed dielectric regions are damaged as a result of the high $O_2$ of the RIE. After the gate is etched and photoresist stripped, in this embodiment of the present invention, dilute HF is used to wet clean the surface of the device and remove the damaged portion of the gate dielectric as well as the sidewall buildup, leaving the structure shown in FIG. 3e. In other embodiments, other materials and techniques may be used to remove the damaged portion of the gate dielectric and to remove the sidewall buildup. For example, selective wet or dry etch or plasma ashing could be used. The length of the buildup region 334 can be controlled as a function of the parameters used for the RIE. Ultimately, it is the length of the buildup region 334 that defines the length that the gate dielectric exceeds the gate electrode.

After the patterning and etching of gate electrode 106 and gate dielectric 104, lightly doped source/drain regions 107 can be implanted using the gate dielectric 104 and gate electrode 106 as a mask. Other implants (e.g., pocket implants, halo implants or double-diffused regions) can also be performed as desired.

Figure 3F:
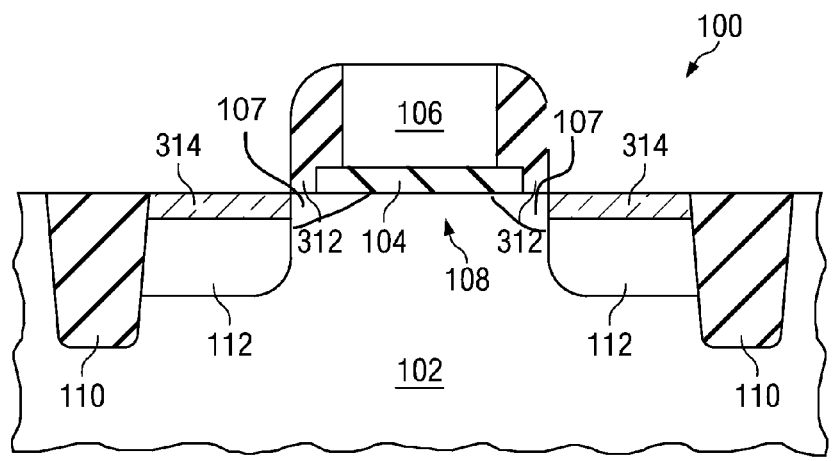

As shown in FIG. 3f, spacers 312, which are formed from an insulating material such as an oxide and/or a nitride, can be formed on the sidewalls of the gate electrode 106 and the gate dielectric 104. The spacers 312 are typically formed by the deposition of a conformal layer followed by an anisotropic etch. The process can be repeated for multiple layers, as desired.

The upper surface device 100 is exposed to a p-type ion implant forming the heavily doped source/drain regions 112. If device 100 is a p-channel device, for example, boron ions can be implanted with a dose of about $5 \times 10^{14}$ $cm^{-2}$ to about $5 \times 10^{15}$ $cm^{-2}$ and an implant energy between about 1 keV and about 5 keV. In other embodiments, other materials, such as $BF_2$, can be implanted. If, on the other hand, device 100 is an n-channel device, an n-type ion implant is used to form the heavily doped source/drain regions 112 of the n-channel transistor. In the preferred embodiment, arsenic or phosphorus ions are implanted into the source/drain regions 112. For example, As ions can be implanted with a dose of about $1 \times 10^{15}$ $cm^{-2}$ to about $5 \times 10^{15}$ $cm^{-2}$ and an implant energy between about 10 keV and about 50 keV. In other embodiments, other materials, such as P, can be implanted.

Silicide regions 314 can then be formed over the source/drain regions 112, and a silicide region (not shown) can be formed over the gate electrode 106 to form low resistivity upper surface regions. Silicide is formed by first depositing a silicidation metal over the source and drain regions 112 and over the gate electrode 106, then subjecting the structure to an annealing process. In the preferred embodiment, the silicidation metal is nickel, but the metal could also be cobalt, copper, molybdenum, titanium, tantalum, tungsten, erbium, zirconium, platinum, or combinations thereof. In one example, the semiconductor body 102 is then heated to about 600° C. or 700° C. to form a single layer of nickel silicide.

Figure 3G:
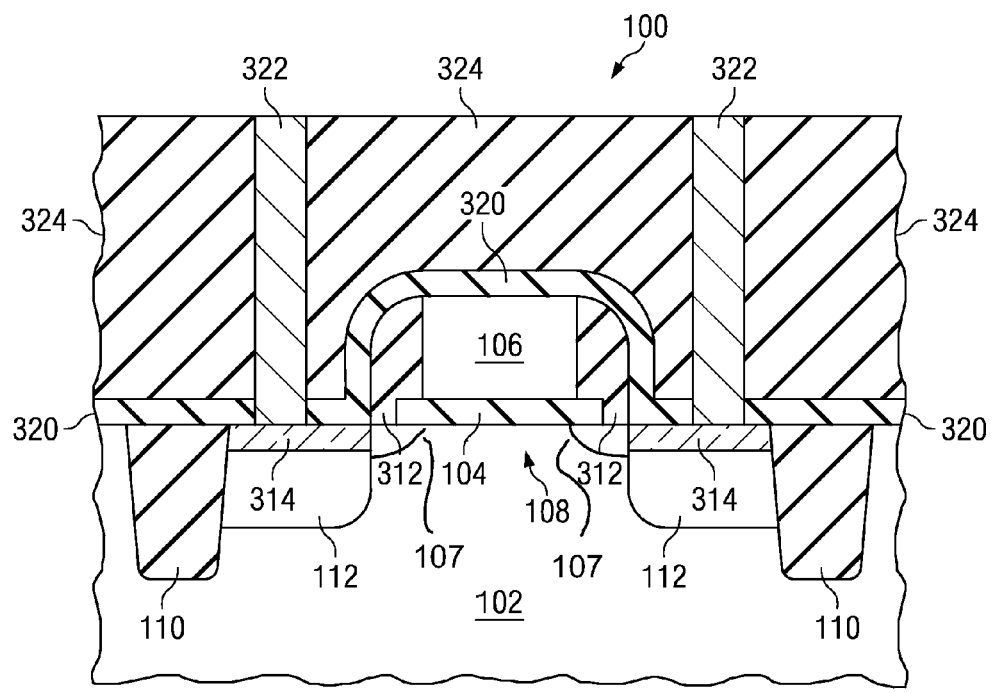

Referring now to FIG. 3g, a contact etch stop layer 320 (CESL) is formed over the surface of the device 100. In a preferred embodiment of the present invention, a nitride film (e.g., silicon nitride) is deposited, but other materials can be deposited. An interlayer dielectric (ILD) layer 324 is then formed over the CESL 320. Suitable ILD layers include materials such as doped glass (BPSG, PSG, BSG), organo silicate glass (OSG), fluorinated silicate glass (FSG), spun-on-glass (SOG), silicon nitride, and PE plasma enhanced tetraethyloxysilane (TEOS), as examples.

In regions where contact holes are made, the ILD 324 is etched down to the CESL 320. Photoresist (not shown) is deposited to mask off the non-exposed regions to the etch process. The ILD 324 is then etched down to the CESL 320 using standard etch techniques. In this step, the ILD 324 etches away at a faster rate than the CESL 320. Once the etch is complete, the photoresist may be removed. A second etch is then performed. This time, the CESL 320 is etched to expose the silicided source/drain regions 112 using the ILD 320 as a mask using standard etch techniques.

Source/drain contacts 322 are formed through the interlayer dielectric by depositing conductive material on the exposed portions of the silicided source/drain regions 314. Any standard contact fabrication technique may be used. Typically, a liner, such as TiN, is deposited to form an ohmic contact, after which tungsten is deposited using CVD techniques. Metallization layers that interconnect the various components are also included in the chip, but not illustrated for the purpose of simplicity.

FIGS. 4a-4d provide cross-sectional views that illustrate an alternate embodiment for forming a semiconductor device 100 of the present invention.

Figure 4A:
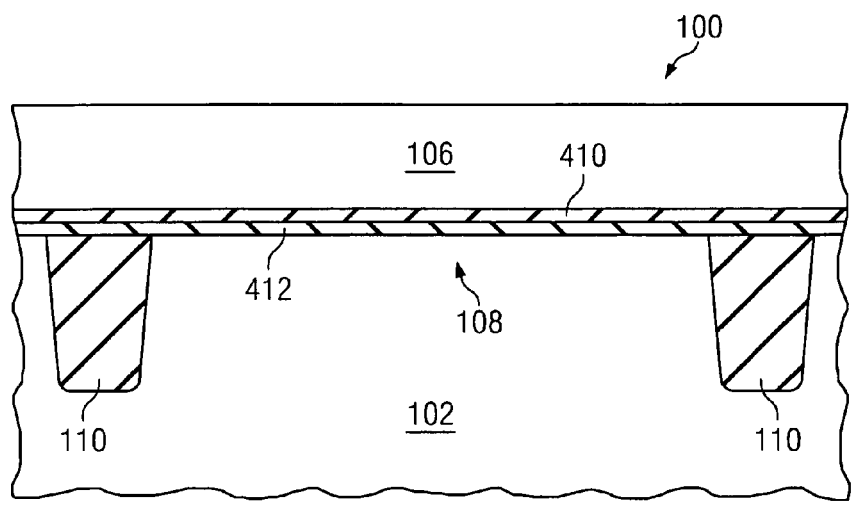
FIGS. 4a-4d provide cross-sectional views of a second embodiment process.

Referring to FIG. 4a, a semiconductor body 102, spacers 110, and a channel region 108 are provided and a gate stack is formed over a semiconductor body 102. In this embodiment of the present invention, the gate stack contains a SiON layer 412 deposited over the semiconductor body 102, a high-k dielectric layer 410 deposited over the SiON layer, and a gate electrode layer 106 deposited over the high-k dielectric layer 410. As before, in some embodiments of the present invention, however, the gate stack may consist of a single gate dielectric such as a thin oxide layer, or a high-k dielectric layer. In other embodiments of the present invention, the gate stack may contain multiple layers of material. The deposition of the gate stack layers is done using standard processing techniques as described above herein.

Figure 4B:
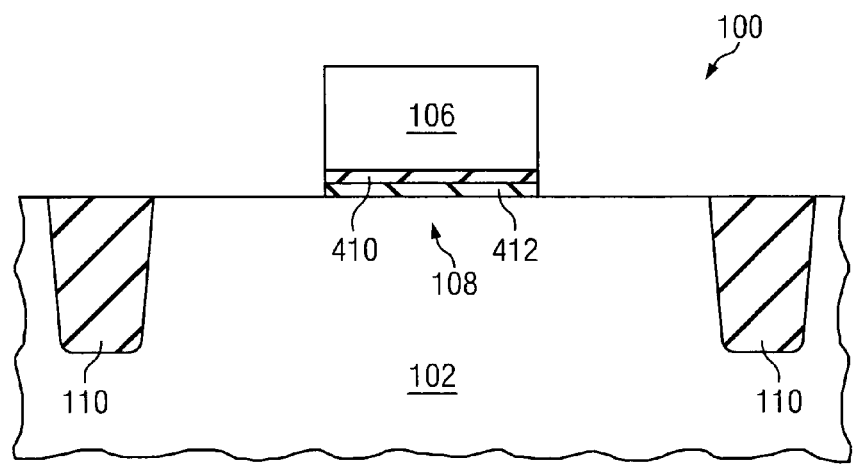

Turning to FIG. 4b, the gate stack is patterned and etched using a reactive ion etch (RIE). In other embodiments of the present invention other techniques can be used to pattern and etch the gate stack.

Figure 4C:
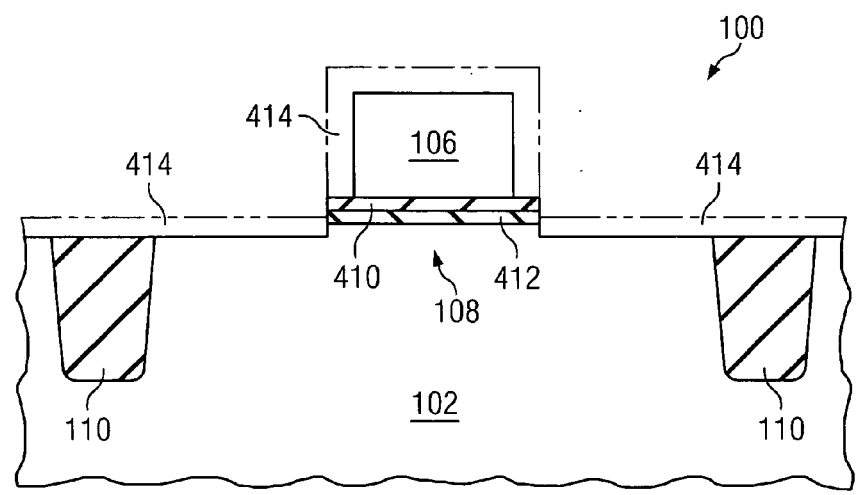
Figure 4D:
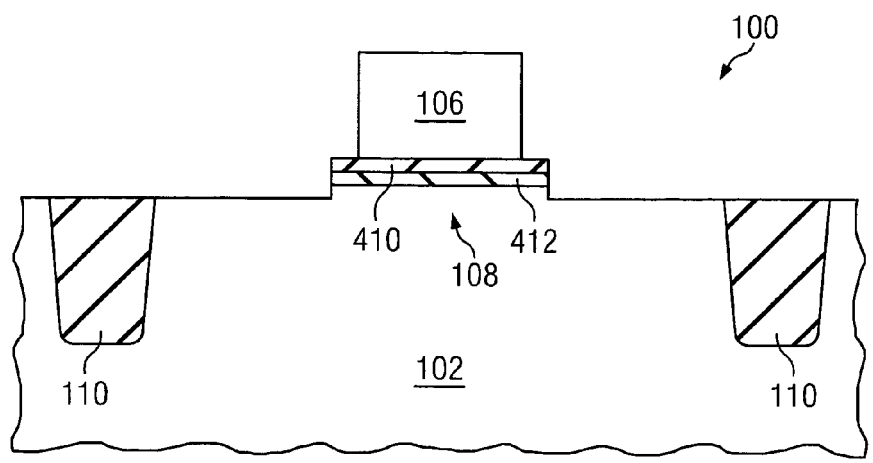

As shown in FIG. 4c, a re-ox process is then performed such that the thickness of the re-ox 414 corresponds to the desired extension of the high-k dielectric 410 beyond the gate electrode 106. A wet etch is performed to remove the re-ox so that the high-k dielectric 410 is exposed, as shown in FIG. 4d. Processing continues as discussed above according to FIGS. 3f-3g.

FIGS. 5a-5f provide cross-sectional views that illustrate another embodiment for forming a semiconductor device 100 of the present invention.

Figure 5A:
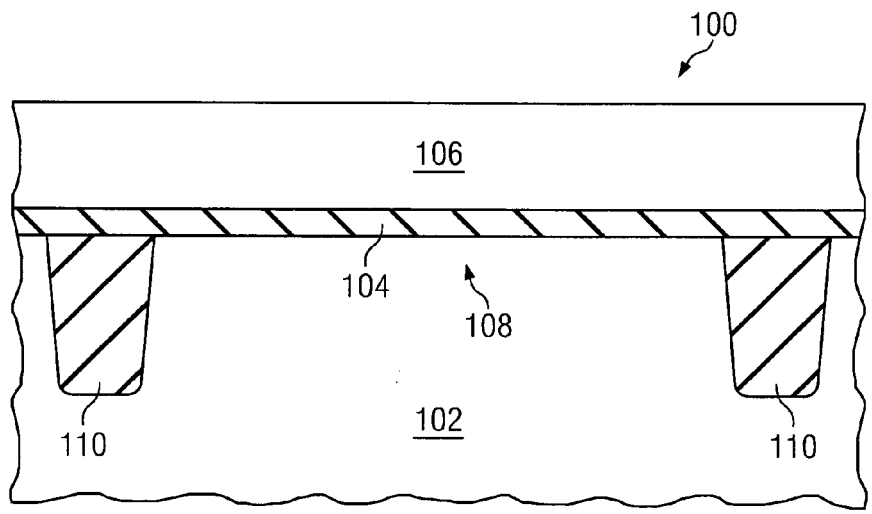
FIGS. 5a-5f provide cross-sectional views of a third embodiment process.

Referring to FIG. 5a, a semiconductor body 102, with isolation regions 110, is provided and a gate stack is formed over a semiconductor body 102. In this embodiment of the present invention, a dielectric layer 104 is deposited over the semiconductor body, 102. In some embodiments of the present invention, however, the gate stack may consist of a single gate dielectric such as a thin oxide layer, or a high-k dielectric layer. In other embodiments of the present invention, the gate stack may contain multiple layers of material. A gate electrode layer 106 is deposited over the dielectric layer 104. The deposition of the gate dielectric and the gate electrode stack layers is achieved using processing techniques as described above herein.

Figure 5B:
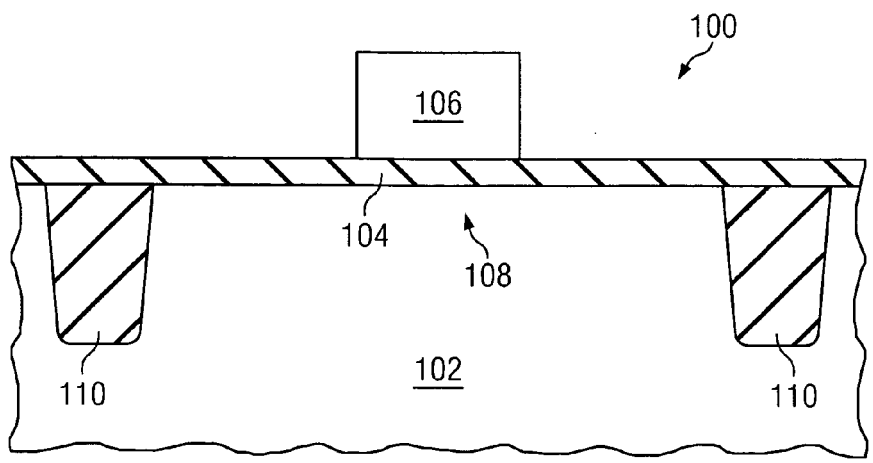

Turning to FIG. 5b, the gate electrode layer 106 is patterned and etched using known photolithography techniques to create the gate electrode 106 of the proper pattern. In a preferred embodiment of the present invention, the gate layer will be etched to achieve a gate length of less than 60 nm, for example, 45 nm.

Figure 5C:
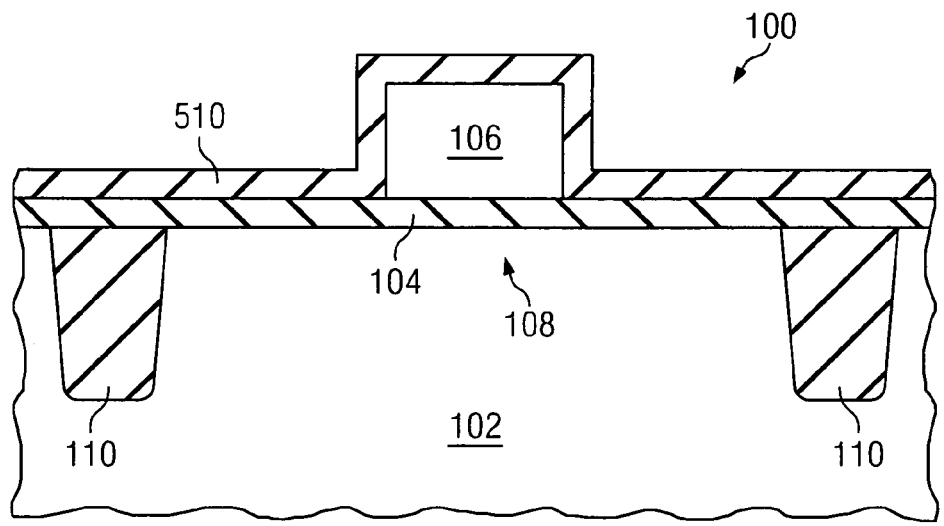
Figure 5D:
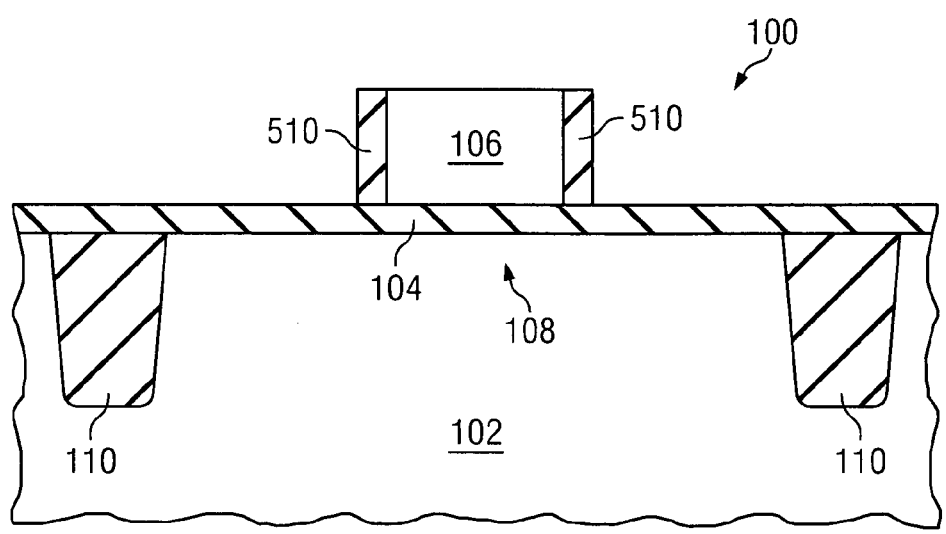

As shown in FIG. 5c, a masking layer 510 is deposited over the gate electrode 106 so that the thickness of the masking layer on the sides of the gate electrode corresponds to the desired over length offset, ΔL, of the gate dielectric 104 with respect to the gate electrode. The masking layer is first deposited over the entire structure, then an anisotropic etch is performed so that the masking layer remains only on the sidewalls of gate electrode 106, as shown in FIG. 5d.

Figure 5E:
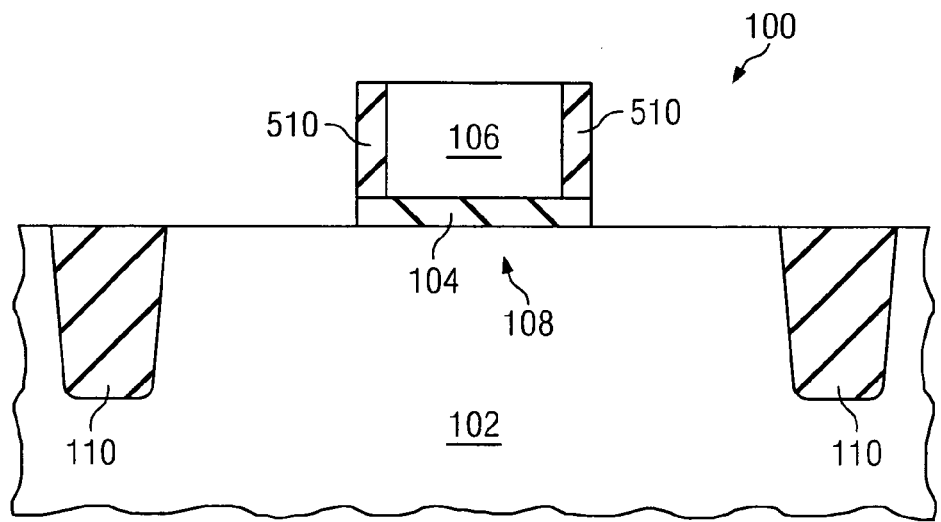
Figure 5F:
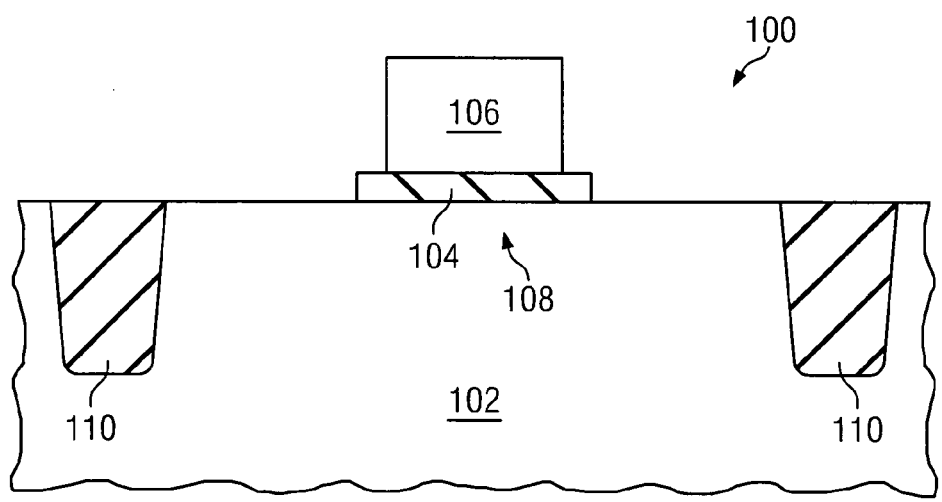

Turning to FIG. 5e, the gate dielectric 104 is etched so that the edges of the gate dielectric are aligned to the edges of the masking layer. The masking layer is then removed using standard techniques as shown in FIG. 5f. After the gate dielectric is removed in alignment with the sidewall mask 510, processing continues as discussed herein above according to FIGS. 3f-3g.

It will also be readily understood by those skilled in the art that materials and methods may be varied while remaining within the scope of the present invention. It is also appreciated that the present invention provides many applicable inventive concepts other than the specific contexts used to illustrate preferred embodiments. Accordingly, the appended claims are intended to include within their scope such processes, machines, manufacture, compositions of matter, means, methods, or steps.

What is claimed is:

1. A semiconductor device comprising:
   a semiconductor body;
   a gate electrode disposed over the semiconductor body, the gate electrode having a first length extending between a first edge and a second edge;
   a gate dielectric between the gate electrode and the semiconductor body, the gate dielectric having a second length extending between a first edge and second edge of said gate dielectric and wherein said second length is greater than the first length, wherein the gate dielectric comprise a trapezoidal shape such that a top surface area of the gate dielectric adjacent the gate electrode is smaller than an opposite bottom surface area of the gate dielectric adjacent the semiconductor body;
   a first heavily doped source/drain region disposed within the semiconductor body, the first heavily doped source/drain region extending towards said gate dielectric and up to said first edge of the gate electrode, wherein a portion of the first heavily doped source/drain region is disposed under the gate dielectric; and
   a second heavily doped source/drain region disposed within the semiconductor body, the second heavily doped source/drain region extending up to said second edge of the gate electrode such that the second heavily doped source/drain region is spaced from the first heavily doped source/drain region by a channel region that underlies the gate dielectric and the gate electrode, wherein a portion of the second heavily doped source/drain region is disposed under the gate dielectric.

2. The semiconductor device of claim 1, wherein the gate dielectric at least partially overlaps a first lightly doped source/drain region and a second lightly doped source/drain region.

3. The semiconductor device of claim 1, wherein the ratio of the first length to the second length is between 1:1.04 and 1:1.1.

4. The semiconductor device of claim 1, wherein the ratio of the first length to the second length is between 1:1.08 and 1:1.1.

5. The semiconductor device of claim 1, wherein the second length is greater than the first length by between about 1 nm and about 5 nm.

6. The semiconductor device of claim 1, wherein the first length is less than 60 nm.

7. The semiconductor device of claim 1, wherein the gate dielectric comprises a high-k dielectric.

8. The semiconductor device of claim 7, further comprising an interfacial/barrier layer between the semiconductor body and the high-k dielectric.

9. The semiconductor device of claim 7, further comprising an interfacial/barrier layer between the high-k dielectric and the gate electrode.

10. A transistor comprising:
- a semiconductor body;
- a channel region within the semiconductor body;
- a gate dielectric disposed over the channel region;
- a gate electrode disposed over the gate dielectric, the gate electrode being narrower in length than the gate dielectric such that the gate dielectric includes a first extending portion that extends away from a first edge of the gate electrode and also includes a second extending portion that extends away from a second edge of the gate electrode, wherein the gate dielectric comprise a trapezoidal shape such that a top surface area of the gate dielectric adjacent the gate electrode is smaller than an opposite bottom surface area of the gate dielectric adjacent the semiconductor body;
- a first portion of said semiconductor body, said first portion being heavily doped and forming a first source/drain region extending up to said first edge of said gate electrode, wherein a portion of the first source/drain region is disposed under the gate dielectric; and
- a second portion of said semiconductor body, said second portion being heavily doped and forming a second source/drain region extending up to said second edge of said gate electrode, wherein a portion of the second source/drain region is disposed under the gate dielectric.

11. The transistor of claim 10, further comprising:
- a first sidewall spacer having an inside edge in contact with a sidewall of the gate electrode and overlying the first extending portion of the gate dielectric, the first sidewall spacer having an outside edge extending past the first extending portion of the gate dielectric such that the first sidewall spacer extends farther away from the gate electrode than the gate dielectric; and
- a second sidewall spacer having an inside edge in contact with a sidewall of the gate electrode and overlying the second extending portion of the gate dielectric, the second sidewall spacer having an outside edge extending past the second extending portion of the gate dielectric such that the second sidewall spacer extends farther away from the gate electrode than the gate dielectric.

12. The transistor of claim 10, wherein the transistor comprises an n-channel MOS transistor.

13. The transistor of claim 10, wherein the transistor comprises a p-channel MOS transistor.

14. The semiconductor device of claim 8 further comprising an interfacial/barrier between the high-k dielectric and the gate electrode.

15. The semiconductor device of claim 1, further comprising:
- first and second spacers, each having an inside edge adjacent to the gate electrode and each having an outside edge.

16. The transistor of claim 11, further comprising:
- a first source/drain extension region formed in said semiconductor body and underlying the first sidewall spacer; and
- a second source/drain extension region underlying the second sidewall spacer.

* * * * *